United States Patent [19]
Shin et al.

[11] Patent Number: 5,914,276
[45] Date of Patent: Jun. 22, 1999

[54] METHODS OF FORMING ELECTRICALLY CONDUCTIVE LINES USING NITROGEN AND CHLORINE CONTAINING GAS MIXTURES

[75] Inventors: Hwa-sook Shin; Kyeong-koo Chi, both of Kyungki-do, Rep. of Korea

[73] Assignee: Samsung Eletronics Co., Ltd., Suwon, Rep. of Korea

[21] Appl. No.: 08/885,336

[22] Filed: Jun. 30, 1997

[30] Foreign Application Priority Data

Jun. 29, 1996 [KR] Rep. of Korea ...................... 96-25927

[51] Int. Cl.⁶ ................................................... H01L 21/00
[52] U.S. Cl. .......................... 438/714; 438/721; 438/742; 216/41; 216/67; 216/79
[58] Field of Search ..................................... 438/714, 720, 438/721, 733, 735, 742; 216/41, 67, 79

[56] References Cited

U.S. PATENT DOCUMENTS

| | | | |
|---|---|---|---|
| 4,678,540 | 7/1987 | Uchimura | 438/720 X |
| 5,188,980 | 2/1993 | Lai | 216/79 X |
| 5,512,331 | 4/1996 | Miyakuni | 438/718 |
| 5,582,679 | 12/1996 | Lianjun et al. | 438/720 X |
| 5,605,601 | 2/1997 | Kawasaki | 438/721 X |

*Primary Examiner*—William Powell
*Attorney, Agent, or Firm*—Myers Bigel Sibley & Sajovec

[57] ABSTRACT

Methods of forming electrically conductive lines include the steps of forming a first electrically insulating layer (e.g., $SiO_2$) on a face of a semiconductor substrate and then forming a layer of polycrystalline silicon (polysilicon) as a blanket layer on the first electrically insulating layer. A metal silicide layer (e.g., TiSix) is then formed on the polysilicon layer by reacting the polysilicon layer with an appropriate metal such as titanium (Ti) using a thermal treatment step. Thereafter, a second electrically insulating layer (e.g., $SiO_2$, $Si_3N_4$) is formed on the metal silicide layer using conventional techniques. A layer of photoresist is then deposited onto the second electrically insulating layer and patterned as an etching mask using conventional photolithographic processing steps. The second electrically insulating layer, metal silicide layer and polysilicon layers are then sequentially etched to define a plurality of spaced conductive lines which each comprise a composite of a polysilicon layer and metal silicide layer thereon. Preferably, the metal silicide layer and the polysilicon layer are sequentially dry etched by exposing these layers to a composite gas containing $Cl_2$ and $N_2$ gases which are provided at preferred volumetric flow rates and temperatures greater than 23° C. (i.e., room temperature) so that the amount of polymer residue generated during the etching step is sufficient to protect the interface between the metal silicide layer and the polysilicon layer from lateral overetching but not so excessive as to prevent complete removal of those portions of the metal silicide and polysilicon layers exposed by the openings in the patterned layer of photoresist.

6 Claims, 5 Drawing Sheets

5,914,276

METHODS OF FORMING ELECTRICALLY CONDUCTIVE LINES USING NITROGEN AND CHLORINE CONTAINING GAS MIXTURES

FIELD OF THE INVENTION

The present invention relates to methods of forming semiconductor devices and more particularly methods of forming electrically conductive lines using etching gases.

BACKGROUND OF THE INVENTION

As the degree of integration of semiconductor devices on a substrate increases and the linewidth of conductive lines (e.g., gate electrodes) decreases to about 0.25 µm and below, the use of conductive lines formed of doped polycrystalline silicon (polysilcon) may become problematic. In particular, as the linewidth of polysilicon conductive lines is reduced, the resistance of polysilicon conductive lines is increased and may become sufficiently high so as to significantly increase the transmission delay associated with signals applied thereto even if the polysilicon lines are highly doped.

To overcome such problems, attempts have been made to form polysilicon conductive lines having low resistivity and a work function potential which corresponds to the midgap work function potential of silicon. Recently, conductive lines consisting of a stacked structure of a polysilicon layer and a thermally treated silicide layer have been proposed. For example, conductive lines consisting of tungsten silicide (WSix) or titanium silicide (TiSix) have been widely used. Metal silicides having high melting temperatures, such as cobalt silicide CoSix, have also been used. Among them, TiSix is typically considered superior in terms of thermal stability and barrier characteristics and also typically has a resistivity of about one fourth (¼) the resistivity of WSix. Accordingly, TiSix has typically been considered as a potential gate electrode material for 1-gigabit DRAM devices and even more highly integrated devices. Moreover, in the event TiSix is used as a gate electrode of a field effect transistor, it may be possible to obtain excellent transistor characteristics since TiSix typically has a low resistivity and a work function potential which corresponds to about the midgap work function potential of silicon.

Referring now to FIGS. 1A–1C, cross-sectional views of intermediate structures illustrate a method of forming metal silicide conductive lines according to the prior art. Referring specifically to FIG. 1A, a conductive polysilicon film 6 is formed after forming an oxide film 4 on a face of semiconductor substrate 2. A layer 8 of TiSix is then formed by reacting titanium with the polysilicon film 6 using a thermal treatment step or by sputter depositing a layer of TiSix directly, for example. An insulating film 10 (e.g., $SiO_2$, $Si_3N_4$) is then deposited on the layer 8 of TiSix. Referring now to FIG. 1B, a photoresist pattern 12 is then formed on the insulating film 10 using a photolithography process. Referring now to FIG. 1C, a TiSix film pattern 8a and a polysilicon film pattern 6a are formed by etching the insulating film 10 and then etching the TiSix film 8 and the polysilicon film 6 using the photoresist pattern 12 as an etching mask.

The step of etching the TiSix film 8 and the polysilicon film 6 may be accomplished by performing a dry etching step using a fluorine-containing gas such as $SF_6$ or $CF_4$, a chlorine-containing gas such as HCl, $Cl_2$ or $BCl_3$, or a gas such as Hbr. Unfortunately, the fluorine-containing gases and the chlorine-containing gases are typically not suitable as etching gases because they also cause etching in a lateral direction at the interface between the TiSix film 8 and the polysilicon film 6. As will be understood by those skilled in the art, conductive materials may also remain at the etched interface and these conductive materials may result in the formation of stringers and bridge defects which can reduce device yield.

In the event HBr is used as an etching gas, it may be hard to control a critical dimension (CD) of the TiSix film pattern 8a and the polysilicon film pattern 6a since a substantial amount of a polymer by-product (which is a non-volatile residue) may be generated by the reaction between the TiSix film 8 and the etching gas. In the event $Cl_2$ is used solely as an etching gas, the lateral etching phenomenon may not occur when the photoresist pattern 12 is used as a mask, however, lateral etching may occur when a hard mask, other than a photoresist pattern, is used.

Thus, notwithstanding the above described methods, there continues to be a need for improved methods of forming electrically conductive lines containing silicide layers.

SUMMARY OF THE INVENTION

It is therefore an object of the present invention to provide improved methods of forming electrically conductive lines containing silicide layers therein.

It is another object of the present invention to provide methods for forming electrically conductive lines having high aspect ratios.

These and other objects, features and advantages are provided by methods of forming electrically conductive lines which include the steps of forming a first electrically insulating layer (e.g., $SiO_2$) on a face of a semiconductor substrate and then forming a layer of polycrystalline silicon (polysilicon) as a blanket layer on the first electrically insulating layer. A metal silicide layer (e.g., TiSix) is then formed on the polysilicon layer by reacting the polysilicon layer with an appropriate metal such as titanium (Ti) using a thermal treatment step. According to another embodiment of the present invention, the metal silicide layer may be formed by sputtering a layer of metal silicide onto the polysilicon layer. Thereafter, a second electrically insulating layer (e.g., $SiO_2$, $Si_3N_4$) is formed on the metal silicide layer using conventional techniques. A layer of photoresist is then deposited onto the second electrically insulating layer and patterned as an etching mask using conventional photolithographic processing steps. The second electrically insulating layer, metal silicide layer and polysilicon layers are then sequentially etched to define a plurality of spaced conductive lines which each comprise a composite of a polysilicon layer and metal silicide layer thereon.

Preferably, the metal silicide layer and the polysilicon layer are sequentially dry etched by exposing these layers to a composite gas containing $Cl_2$ and $N_2$ gases which are provided at preferred volumetric flow rates and temperatures greater than 23° C. (i.e., room temperature) so that the amount of polymer by-product (i.e., polymer residue) generated during the etching step is sufficient to protect the interface between the metal silicide layer and the polysilicon layer from lateral overetching but not so excessive as to prevent complete removal of those portions of the metal silicide and polysilicon layers exposed by the openings in the patterned layer of photoresist. In particular, as determined by the inventors herein, the $Cl_2$ and $N_2$ gases are preferably provided at respective first and second flow rates, and where the second flow rate is in a range between about 0.05 and 0.2 times the sum of the first and second flow rates.

Thus, the etching gas preferably comprises $Cl_2$ with between about 0.05 and 0.2 parts $N_2$ by volume.

DESCRIPTION OF PREFERRED EMBODIMENTS

Figure 1A:
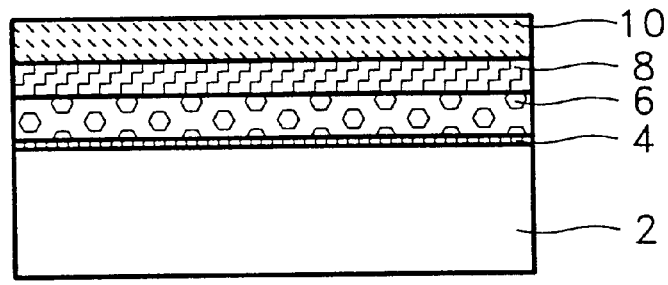
FIGS. 1A–1C are cross-sectional views of intermediate structures which illustrate a method of forming electrically conductive lines according to the prior art.
Figure 1B:
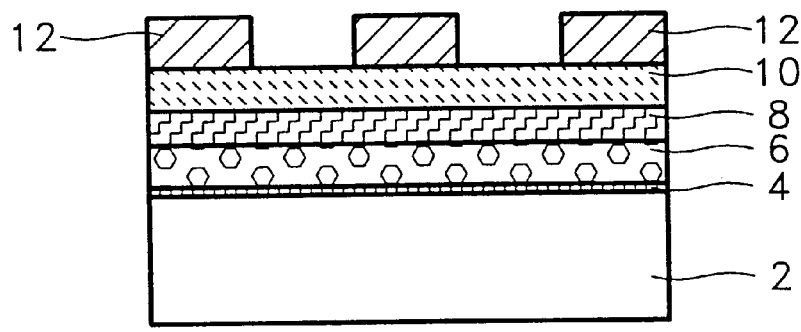
Figure 1C:
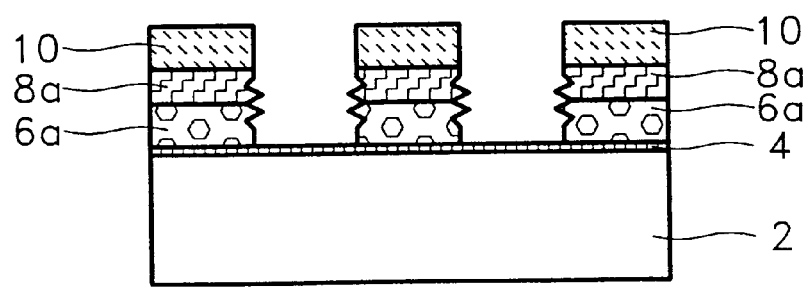

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Preferred methods of forming electrically conductive lines containing polysilicon and silicide layers therein will now be described. In particular, according to a first embodiment of the present invention, a first electrically insulating layer (e.g., $SiO_2$) is initially formed on a face of a semiconductor substrate and then a layer of polycrystalline silicon (polysilicon) is formed as a blanket layer on the first electrically insulating layer. A metal silicide layer (e.g., TiSix) is then formed on the polysilicon layer by reacting the polysilicon layer with an appropriate metal such as titanium (Ti) using a thermal treatment step. According to another embodiment of the present invention, the metal silicide layer may be formed by sputtering a layer of metal silicide onto the polysilicon layer. Thereafter, a second electrically insulating layer (e.g., $SiO_2$, $Si_3N_4$) is formed on the metal silicide layer using conventional techniques. A layer of photoresist is then deposited onto the second electrically insulating layer and patterned as an etching mask using conventional photolithographic processing steps. The second electrically insulating layer, metal silicide layer and polysilicon layers are then sequentially etched to define a plurality of spaced conductive lines which each comprise a composite of a polysilicon layer and metal silicide layer thereon. Preferably, the metal silicide layer and the polysilicon layer are sequentially dry etched by exposing these layers to a composite gas containing $Cl_2$ and $N_2$ gases which are provided at preferred volumetric flow rates and temperatures greater than 23° C. (i.e., room temperature) so that the amount of polymer by-product (i.e., polymer residue) generated during the etching step is sufficient to protect the interface between the metal silicide layer and the polysilicon layer from lateral overetching but not so excessive as to prevent complete removal of those portions of the metal silicide and polysilicon layers exposed by the openings in the patterned layer of photoresist. In particular, as determined by the inventors herein, the $Cl_2$ and $N_2$ gases are preferably provided at respective first and second flow rates, and where the second flow rate is in a range between about 0.05 and 0.2 times the sum of the first and second flow rates. Thus, the etching gas preferably comprises $Cl_2$ with between about 0.05 and 0.2 parts $N_2$ by volume.

Referring now specifically to the SEM photographs of FIGS. 3A–3C and FIGS. 4A–4C, additional features of the present invention will be described. First, the degree of lateral etching at the silicide/polysilicon interface was measured by varying the composition of the etching gases during the step of etching the composite TiSix/polysilicon film. The results indicate that the degree of lateral etching is significantly reduced when a preferred amount of $N_2$ gas is added to the $Cl_2$ etching gas. During these etching steps, the temperature of the semiconductor substrate was maintained at or above room temperature and the processing pressure was maintained at about 2 mTorr. When a composite etching gas of $N_2/Cl_2$ is used, polymer by-products including Ti (such as TiCl4, TiCl3, TiCl2 and TiN) are generated. Such Ti-containing by-products can inhibit the etching of the TiSix film during the etching of the TiSix/polysilicon film since Ti-containing by-products act as a protective film. The chemical equation during etching of the TiSix film using the $N_2/Cl_2$ gas is as follows:

$$TiSix + Cl_2 \rightarrow TiCl_4, SiCl_4 \qquad (1)$$

$$TiSix + N_2 \rightarrow TiN, SiN \qquad (2)$$

Here, the end-products $TiCl_4$ or $SiCl_4$ illustrated by equation (1) are volatile materials which do not act as a protective film. However, when the $N_2$ gas is added to the $Cl_2$ etching gas, nonvolatile materials including TiN or SiN are generated as shown by equation (2), and these materials act as protective films for protecting the sidewalls of the composite TiSix/polysilicon conductive lines.

Figure 2:
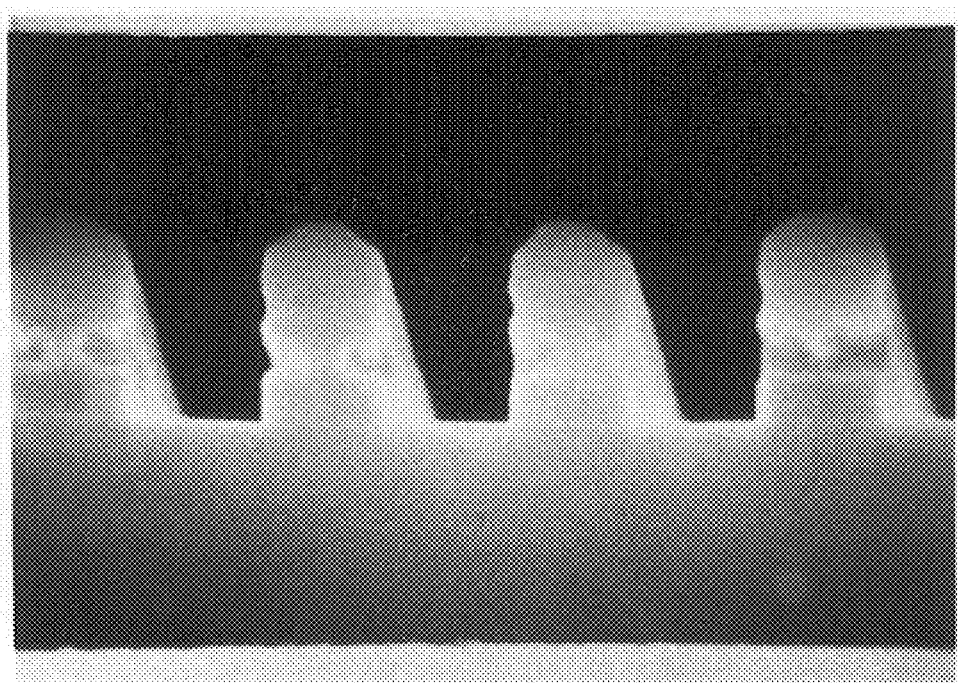
FIG. 2 is a scanning electron microscope (SEM) photograph which illustrates a cross-sectional view of a plurality of electrically conductive lines which were etched using a $Cl_2$ gas and contain silicide layers therein, according to the prior art.
Figure 3A:
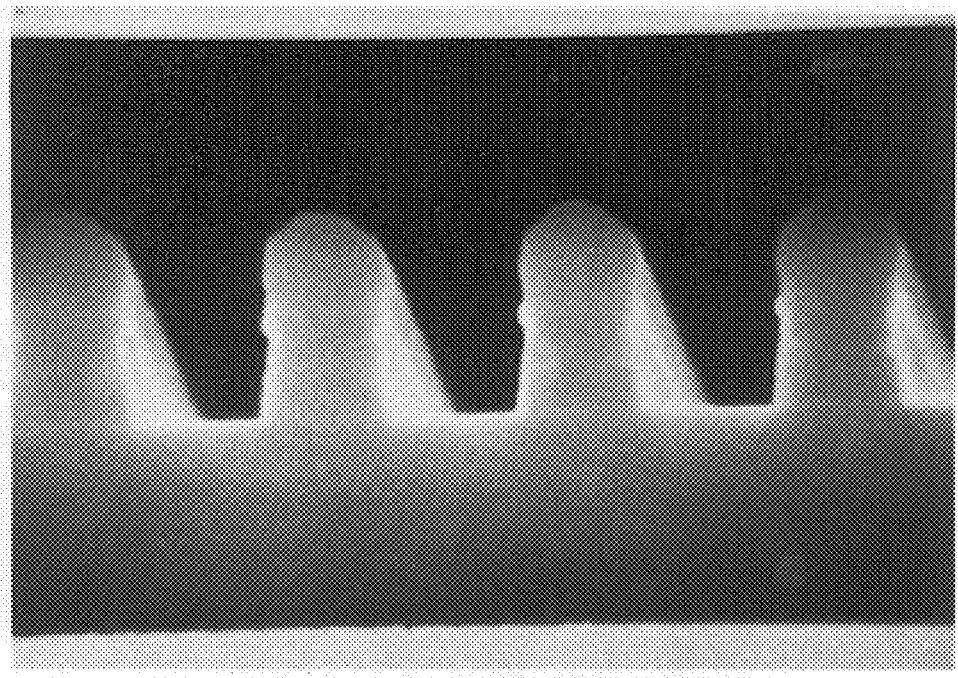
FIGS. 3A to 3C are SEM photographs which illustrate cross-sectional views of a plurality of electrically conductive lines which were etched using a $Cl_2/N_2$ gas containing various relative concentrations of $N_2$, according to an embodiment of the present invention.
Figure 3B:
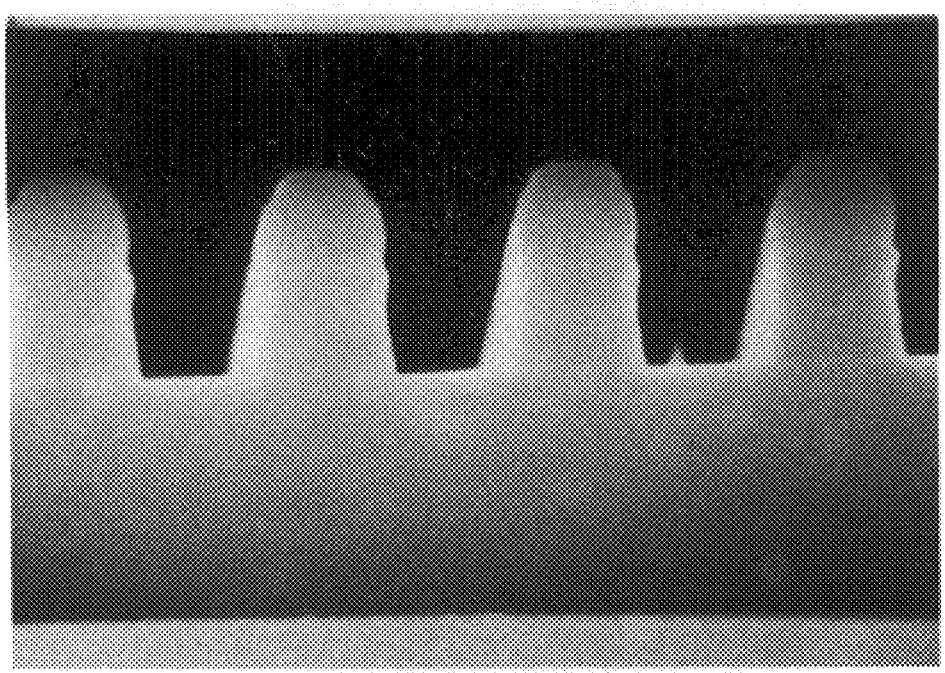
Figure 3C:
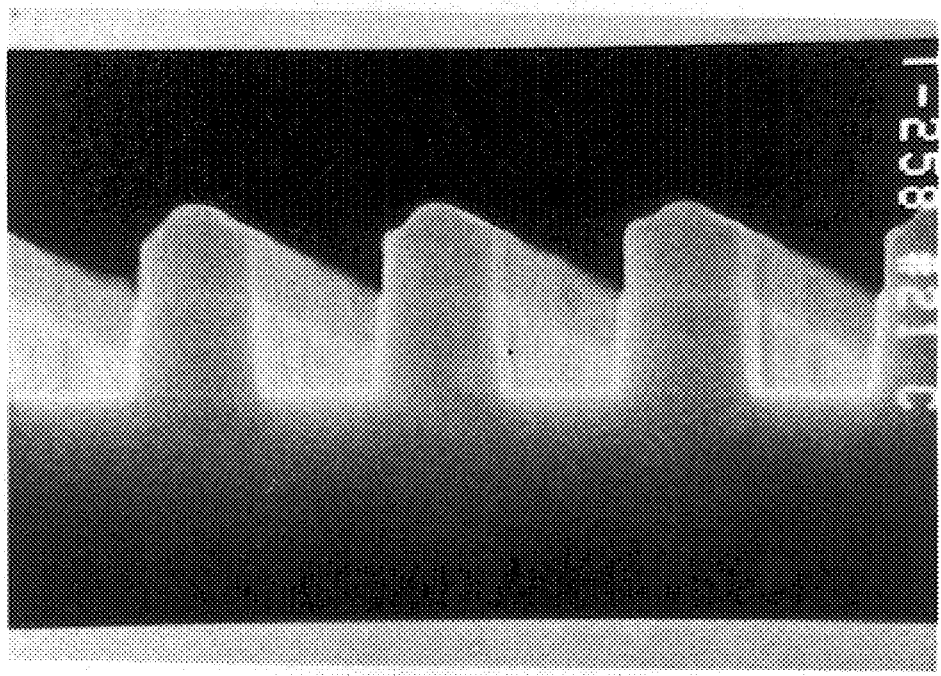

FIG. 2 is a scanning electron microscope (SEM) photograph which illustrates a cross-sectional view of a plurality of electrically conductive lines which were etched using a $Cl_2$ gas in accordance with the prior art. FIGS. 3A to 3C are SEM photographs which illustrate cross-sectional views of a plurality of electrically conductive lines which were etched using a $Cl_2/N_2$ gas containing various relative concentrations of $N_2$, according to an embodiment of the present invention. In particular, for FIG. 3A, the $N_2$ gas flow rate was 0.04 times the flow rate of the entire gas mixture. For FIG. 3B, the $N_2$ gas flow rate was 0.08 times the flow rate of the entire gas mixture and for FIG. 3C, the $N_2$ gas flow rate was 0.12 times the flow rate of the entire gas mixture. As determined by the inventors herein, the optimal flow rate of the $N_2$ gas for preventing excessive lateral etching during the step of etching the TiSix film is about 0.05 times to 0.2 times the flow rate of entire etching gas mixture. When the flow rate of the $N_2$ gas is more than 0.2 times, it is hard to control the critical dimension (CD) of the pattern since excessive amounts of polymer are generated and these excessive amounts of polymer inhibit etching of the composite TiSix/polysilicon film.

Figure 4A:
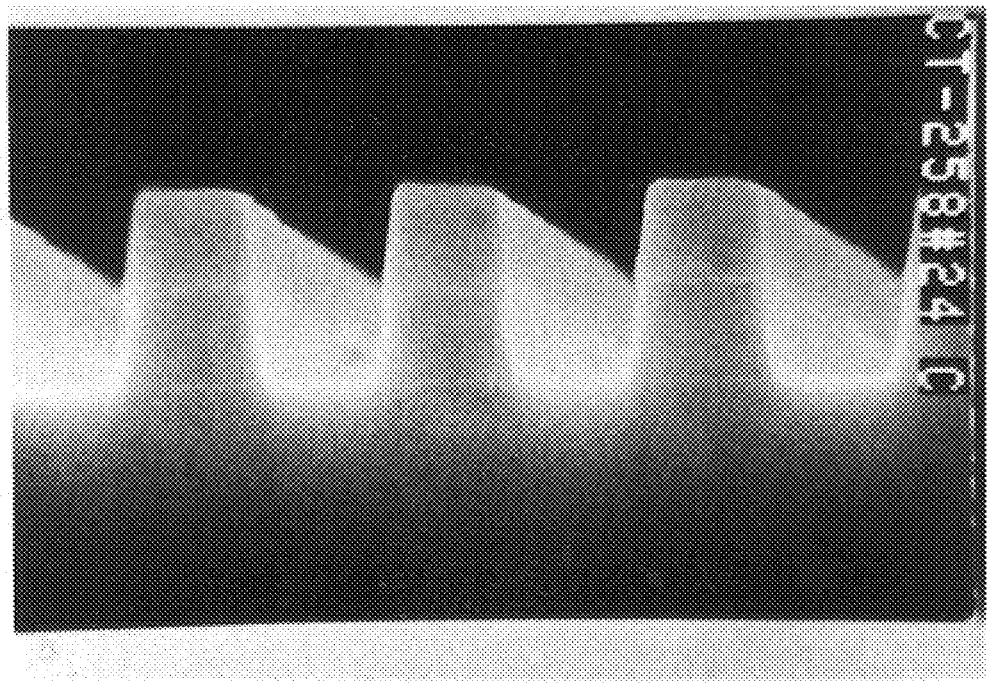
FIGS. 4A to 4C are SEM photographs which illustrate cross-sectional views of a plurality of electrically conductive lines which were etched using a $Cl_2/N_2$ gas at temperatures of −30° C., 0° C. and 30° C., respectively, according to an embodiment of the present invention.
Figure 4B:
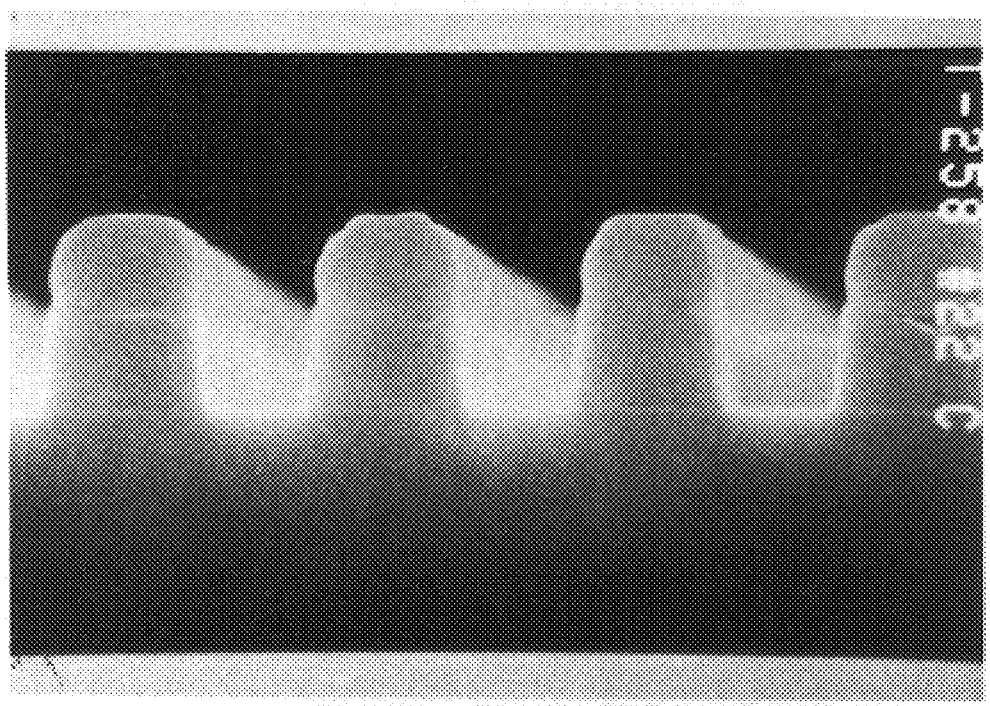
Figure 4C:
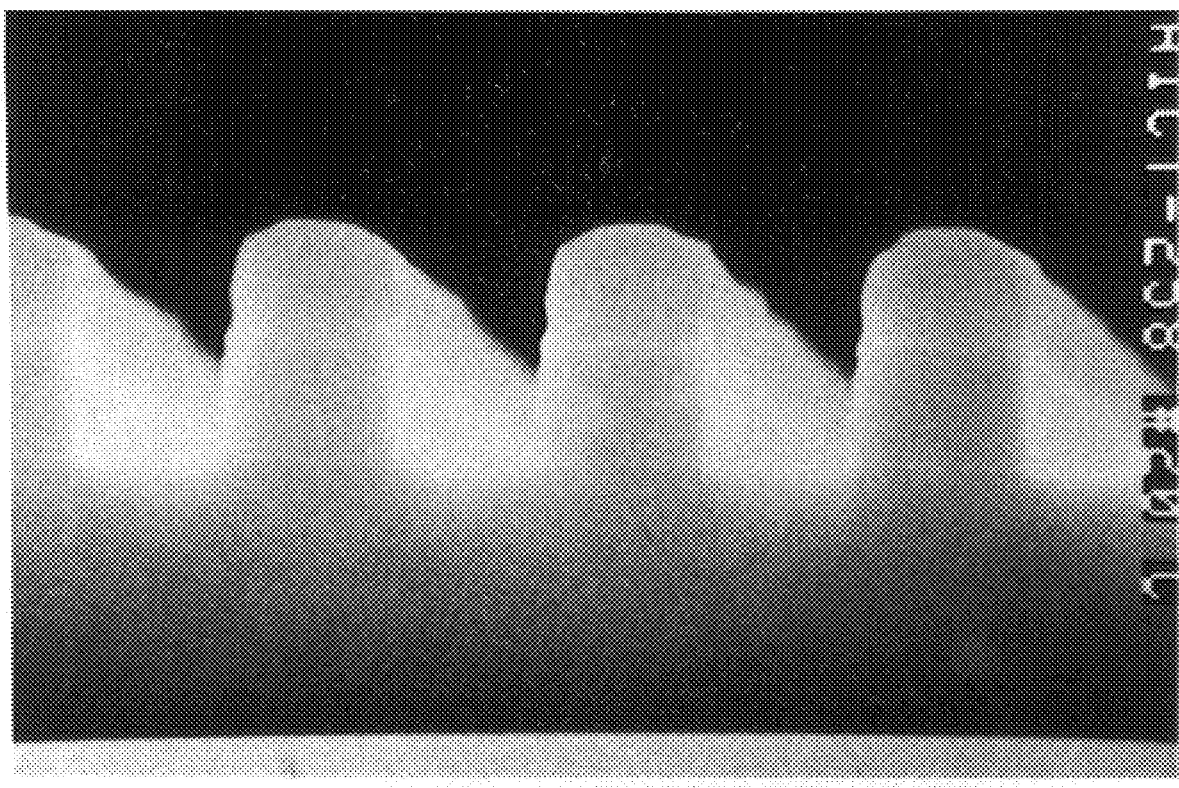

The temperature at which the etching step is performed is also important. For example, FIGS. 4A to 4C are SEM photographs which illustrate cross-sectional views of a plurality of electrically conductive lines which were etched using a $Cl_2/N_2$ gas at temperatures of −30° C., 0° C. and 30° C., respectively, according to an embodiment of the present invention. As illustrated by FIGS. 4A–4C, excessive lateral etching can be prevented by the formation of an appropriate amount of polymer residue. In particular, as determined by the inventors herein, it is possible to minimize the parasitic effects of lateral etching by using $N_2$ and $Cl_2$ gases at optimal flow rates and by maintaining the temperature of the semiconductor substrate and gas atmosphere at a temperature greater than room temperature.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrically conductive line, comprising the steps of:

forming an electrically conductive layer as a composite of a metal silicide layer and a polysilicon layer opposite a face of a substrate;

patterning an etching mask on the electrically conductive layer to expose portions thereof; and selectively etching the exposed portions of the electrically conductive layer using a gas containing chlorine and nitrogen.

2. The method of claim 1, wherein said step of selectively etching the exposed portions of the electrically conductive layer comprises providing $Cl_2$ and $N_2$ to the exposed portions of the electrically conductive layer at respective first and second flow rates; and wherein the second flow rate is in a range between about 0.05 and 0.2 times the sum of the first and second flow rates.

3. The method of claim 2, wherein said step of providing $Cl_2$ and $N_2$ to the exposed portions of the electrically conductive layer comprises providing $Cl_2$ and $N_2$ at temperatures greater than 23° C.

4. A method of forming an electrically conductive line, comprising the steps of:

forming an electrically conductive layer comprising a composite of a metal silicide layer and a polysilicon layer, on a substrate; and selectively etching the metal silicide layer and the polysilicon layer using a gas containing chlorine and nitrogen.

5. The method of claim 4, wherein said step of selectively etching the metal silicide layer and the polysilicon layer comprises exposing the electrically conductive layer to $Cl_2$ and $N_2$ by providing $Cl_2$ and $N_2$ to the electrically conductive layer at respective first and second flow rates; and wherein the second flow rate is in a range between about 0.05 and 0.2 times the sum of the first and second flow rates.

6. The method of claim 5, wherein said step of providing $Cl_2$ and $N_2$ to the exposed portions of the electrically conductive layer comprises providing $Cl_2$ and $N_2$ at temperatures greater than 23° C.

* * * * *